(12) United States Patent
Dixey et al.

(10) Patent No.: US 7,665,313 B2
(45) Date of Patent: Feb. 23, 2010

(54) SUSPENSION TENSIONING ARRANGEMENTS

(75) Inventors: Paul Dixey, Cumnor (GB); Nicholas Mann, Compton (GB)

(73) Assignee: Siemens plc, Frimley, Camberley (GB)

( * ) Notice: Subject to any disclaimer, the term of this patent is extended or adjusted under 35 U.S.C. 154(b) by 548 days.

(21) Appl. No.: 11/702,506

(22) Filed: Feb. 6, 2007

(65) Prior Publication Data

US 2007/0246630 A1    Oct. 25, 2007

(30) Foreign Application Priority Data

Feb. 9, 2006   (GB) ................. 0602599.3

(51) Int. Cl.
*F25B 19/00* (2006.01)
(52) U.S. Cl. ...................... 62/51.1; 248/324
(58) Field of Classification Search ............... 62/51.1, 62/297; 248/317, 323, 324; 220/560.05, 220/560.09, 560.1, 901
See application file for complete search history.

(56) References Cited

U.S. PATENT DOCUMENTS 3,155,265 A * 11/1964 Reese .............. 220/560.05
4,325,530 A    4/1982 Niemann et al.
4,516,405 A *  5/1985 Laskaris ............. 62/50.7
6,267,333 B1 * 7/2001 Hebert et al. ........... 248/72

FOREIGN PATENT DOCUMENTS

| CS | 275004 (B6) | 6/1989 |
| EP | 0 135 185 | 5/1990 |
| GB | 2 345 745 A | 7/2000 |
| JP | 2003 300589 | 10/2003 |

* cited by examiner

*Primary Examiner*—Korie Chan
(74) *Attorney, Agent, or Firm*—Crowell & Moring LLP

(57) ABSTRACT

A tensioning arrangement for a suspension system comprising an elongate suspension member (2) for attachment to an element to be suspended under tension at a predetermined location relative to a support surface (10); the arrangement comprising a lever arm member (1) having a component (5) adapted to engage with and support said elongate suspension member remotely from said suspended element, wherein said lever arm member is formed with first (7) and second (6) bearing means adapted to bear respectively against first (9) and second (8) spaced-apart regions of said support surface and wherein at least said first bearing means incorporates an adjuster means (3) permitting the said arm member to be moved relative to said first region of said support surface, thereby to permit adjustment of tension in said suspension member.

14 Claims, 1 Drawing Sheet

SUSPENSION TENSIONING ARRANGEMENTS

Figure 1:
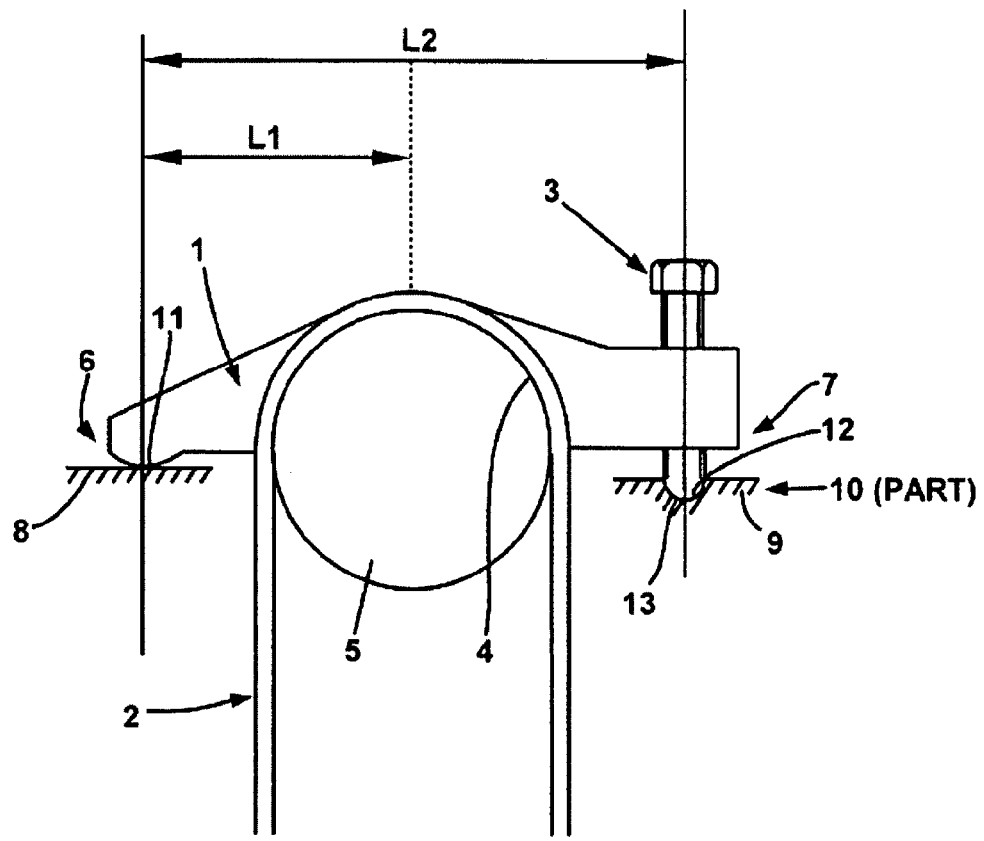

Tension supports for magnets, such as those utilised to support superconducting magnets, require substantial pre-load to ensure that all suspended elements remain under sufficient tension. This is typically achieved by using threaded connections which are tightened, during an assembly process, to achieve the required pre-load. However, the torque required to tighten the screws can be high, and in some applications exceeds the capabilities of hand tools in the space available.

A key requirement for production is an easy and reliable suspension assembly process. Typically, assembly options are limited by the position of load-bearing brackets on the vessels within which the magnets are to be supported, which inevitably must occupy the same space as the tensioning support element itself. The problem is exacerbated by the need to minimise size and complexity of the vessels. The resulting design solutions are typically complex and not well suited to volume production.

This invention aims to provide a reliable and secure suspension tensioning arrangement which can readily be installed and adjusted and which is economical to fabricate.

The present invention therefore provides an arrangement of concentric vessels or shields, one suspended within another, comprising a tensioning arrangement located between walls of first and second vessel(s) and/or shield(s). The tensioning arrangement comprises an elongate suspension member attached to the first concentric vessel or shield under tension at a predetermined location relative to a support surface on the second concentric vessel or shield. The arrangement further comprises a detachable lever arm member having a component adapted to engage with and retain said elongate suspension member remotely from said first vessel or shield. The lever arm member is formed with first and second bearing means adapted to bear respectively against first and second spaced-apart regions of said support surface. At least the first bearing means incorporates an adjuster means permitting the said lever arm member to be moved relative to said first region of said support surface, thereby to permit adjustment of tension in said elongate suspension member.

The elongate suspension member may be substantially planar. The adjuster means may be adjustable by rotation about an axis which lies in the plane of the suspension member.

The arrangement may be configured to give the adjuster means a mechanical advantage, relative to the suspension member. This reduces the load on the adjuster to below that of the elongate suspension member.

The adjuster means may comprise a screw arranged such that an end contacts the respective region of said support surface (10), and the first bearing means may include a threaded through-hole, formed in said lever arm member, to accommodate said screw. In such embodiments, the end of the screw may be formed with a spherical surface and the said first region of the support surface may be formed with a correspondingly shaped recess to accommodate the spherical surface. In such embodiments, at least one of the said spherical surface of said screw and the surface of said recess co-operative therewith may be coated or otherwise treated with a material which facilitates relative motion between the screw and the said co-operative surface of said recess. Alternatively, the spherical surface of the screw and the surface of said recess co-operative therewith are made from materials selected to minimise friction between the screw and the recess.

The second bearing means may be formed with a suitably shaped contact surface which moves relative to the second region of the support surface when the first bearing means is adjusted. At least one of: the contact surface of said second bearing means; and the second region of the support surface may be coated or otherwise treated with a material which facilitates relative motion between them. Alternatively, the contact surface of the second bearing means and the second region of the support surface may be made from materials selected to minimise friction between them.

The elongate suspension member may be substantially planar and loop-shaped. The component of said lever arm member adapted to engage with and retain said elongate suspension member may comprise a boss member having a curved surface region over which said elongate suspension member is looped. The boss member may be integrally formed with said lever arm member. Alternatively, the boss member may be formed separately from said lever arm member and subsequently attached thereto.

The present invention also provides a method for suspending one concentric vessel or shield within another, by tensioning an elongate, substantially planar, loop-shaped suspension member attached to a first of the vessel(s) and/or shield(s), comprising the steps of providing said elongate, substantially planar, loop-shaped suspension member between walls of the vessel(s) and/or shield(s), connecting the suspension member (2) to a first of the vessel(s) and/or shield(s); providing a support surface having first and second spaced-apart regions on a second of the vessel(s) and/or shield(s); after the suspension member is connected, providing a detachable lever arm member having an engaging component adapted to engage with and support said elongate suspension member, wherein said lever arm member is formed with first and second bearing means adapted to bear on respective first and second spaced-apart regions of said support surface wherein at least said first bearing means incorporates an adjuster means permitting the said lever arm member to be moved relative to said first region of said support surface, then, looping the suspension member over the engaging component and adjusting tension in said suspension member by operation of said adjuster means.

Figure 2:
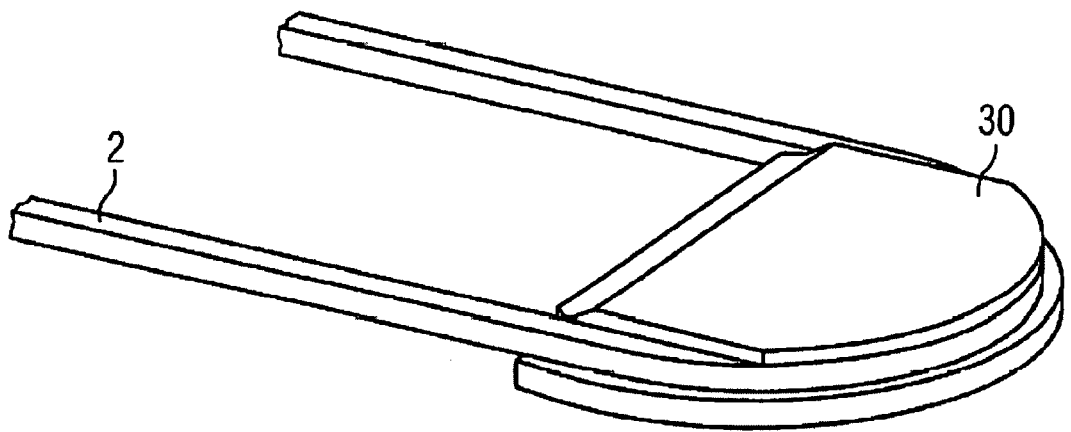

In order that the invention may be clearly understood and readily carried into effect, reference will hereinafter be made, by way of example only, with reference to the accompanying drawings, wherein:

FIG. 1 shows in side elevation an arrangement in accordance with one embodiment of the present invention; and FIG. 2 shows a suspension element mounted on a mounting point, not in itself forming part of the present invention.

In order to maintain the required cryogenic environment, cooled equipment such as a superconducting magnet for use in used in MRI scanners, is typically suspended in a vacuum chamber using high strength suspension elements constructed and configured to minimise heat conduction. To provide high strength, these suspension elements, which may typically be manufactured from composites of epoxy resin with glass or carbon fibers, or from high strength metals, are typically used in tension. This requires that an initial pre-load is applied to the suspension to ensure that all the elements remain tight during shock loads, and that the vessels remain accurately aligned. This pre-load can be high, and special equipment or design features may be required to allow the preload to be applied.

The assembly process of such cryogenically cooled magnets also presents challenges due to the often contradictory requirements of installing thermally efficient components in confined spaces at low production cost. Typically, the resulting solution involves complex suspension end terminations and time consuming assembly procedures which are not suitable for low-cost manufacturing.

Suspension loads can be high, and the vacuum vessels must be strengthened to provide this support. Typically, stiffening structures are required to distribute the concentrated loads into the vessels. Features which naturally reduce the peak stresses and allow them to be more widely spread are thus desirable.

According to the invention there is provided a tensioning arrangement for a suspension system comprising an elongate suspension member for attachment to an element to be suspended under tension at a predetermined location relative to a support surface; the arrangement comprising a lever arm member having a component adapted to engage with and support said elongate suspension member remotely from said suspended element, wherein said lever arm member is formed with first and second bearing means adapted to bear respectively against first and second spaced-apart regions of said support surface and wherein at least said first bearing means incorporates an adjuster means permitting the said arm member to be moved relative to said first region of said support surface, thereby to permit adjustment of tension in said suspension member.

This geometry gives the adjuster means a mechanical advantage, relative to the suspension member, which reduces the load on the adjuster, and hence the effort required to apply a predetermined amount of pre-load.

Preferably, the said adjuster means comprises a screw arranged to contact the respective region of said support surface, and said first bearing means includes a threaded through-hole, formed in said lever arm member, to accommodate said screw.

It is further preferred that the end of the screw is formed with a spherical surface and that the said first region of the support surface is formed with a correspondingly shaped recess to accommodate said spherical head.

In some preferred embodiments, the said spherical surface of said screw and/or the surface of said recess co-operative therewith may bear a coating of, or be otherwise treated with, a material which facilitates relative motion between the screw and the recess, alternatively the materials of the screw and recess may be chosen to work together to minimise friction.

Preferably, said second bearing means is formed with a suitably shaped contact surface which moves relative to said second region of the support surface when the first bearing means is adjusted.

One or more of the facing surfaces of the said contact surface of said second bearing means and said second region of the support surface may bear a coating of, or be otherwise treated with, a material which facilitates relative motion between them. Alternatively the materials of the two parts may be chosen to work together to minimise friction.

Preferably, the component of said lever arm member adapted to engage with and support said elongate suspension member remotely from said suspended element comprises a boss member having a curved surface region over which said elongate suspension member can be looped.

The boss member may be integrally formed with, or formed separately from and attached to, said lever arm member.

In accordance with an embodiment of the present invention, and as shown in FIG. 1, a load bearing, elongate suspension element 2, typically in the form of a composite strap, is connected at one end to the cryogenically cooled equipment, typically an inner vessel which houses a superconducting magnet, and at the other end to a supporting structure, typically an outer vessel. One end of the strap may be mounted on a monolithic mounting point such as shown at 30 in FIG. 2 and described more completely in United Kingdom patent application GB 2426545.

According to the present invention, and referring again to FIG. 1, at least one end of the elongate suspension element 2 is looped over part of the curved surface 4 of a boss 5 formed as part of, or attached to, the centre section of a detachable lever arm 1. The lever arm 1 extends transversely of the boss 5 and is shaped to provide a bearing foot 6 to one side of the boss and a screw-adjuster foot 7 to the other side of the boss. The feet 6 and 7 are designed to bear against matching support blocks, 8 and 9 respectively, on an outer vessel 10. The width of the boss is preferably less than the distance between the feet, but this need not be the case.

The screw-adjuster foot 7 of the lever arm 1 is provided with a tensioning screw 3 which is used to apply a pre-load to the suspension element 2. The other foot 6 of the lever arm 1 is formed with a suitably shaped contact surface 11 which allows the arm to move as required, whilst retaining contact with its block 8, when tensioned. It will be appreciated that, as the screw 3 is turned to adjust the position of foot 7 relative to the block 9, the foot 6 will undergo a rocking motion upon its block 8.

This geometry gives the tensioning screw 3 a mechanical advantage, relative to the suspension element 2, which reduces the load on the screw 3, and hence the torque required to apply the pre-load.

The lever arm 1 can be readily designed to spread the loads to suitable strong points on the outer vessel 10; such points being represented by the blocks 8 and 9 in the drawing. Since the lever arm 1 is a detachable component, it does not interfere with the space required to fit the suspension element 2, and this allows a simplified assembly process, in which the arm is the last component to be installed.

Typically, the suspension element 2 comprises a composite strap, and is supported directly by a suitably shaped surface of the boss 5 formed on or carried by the lever arm 1. The lever arm 1 transfers the loads from the suspension element 2 to the two support blocks 8 and 9 which are fixed to the outer vessel 10. The foot 6 of the lever arm 1 is formed with a surface 11 suitably shaped to allow relative movement between the arm and the support, and to provide constraint as required to maintain alignment of the arm 1 and the suspension element 2. The block 8 may be plain, or it may have a surface shaped to interact in a particular manner with the foot 6.

It will be appreciated that the foot 7 of the arm 1 incorporates a threaded through-hole to receive the tensioning screw 3; the screw conveniently being formed with a spherical end 12 shaped to match a spherical seat 13 formed in the support block 9. This allows rotation of the screw 3 during tensioning, and also accommodates the angular movement of the lever arm.

The mechanical advantage of the tensioning screw 3 relative to the suspension element 2 is controlled by the ratio of the lengths L2 and L1 as shown in the drawing. For example, if L2=2L1, the load in the screw 3 is half that in the suspension element 2. Hence, by adjusting the dimensions of the lever arm 1, the forces in the supports can be optimised to give an efficient vessel structure, provide adequate space for assembly, and keep the torque required at the tensioning screw 3 to apply the pre-load within an acceptable range.

As illustrated, lengths L1 and L2 are preferably greater than the corresponding radius of the curved surface 4 of boss 5. However, certain embodiments of the present invention may be provided where this is not the case; where one or both of the lengths L1 and L2 are equal or inferior to the corresponding radius of the curved surface 4 of boss 5.

It will be appreciated that the support surface for the suspension element 2 is preferably a curved surface such as 4, but this need not comprise part of a boss such as 5, and in particular any part of the support surface which does not contact the suspension element 2 may be of any convenient shape. Moreover the support surface such as 4 may be provided by a component formed integrally with the lever arm or attached thereto by any suitable means.

The non-adjustable foot 6 of the lever arm 1 may, if desired, be coated with a material such as polytetrafluoroethylene ("TEFLON®"), or otherwise treated, to increase the ease with which it can move, relative to the block 8, as the screw 3 is adjusted. Alternatively, or in addition, such a coating or treatment may be applied to the surface of block 8. Likewise, the spherical bearing surface 12 of screw 3 and/or the surface of the screw-head-receiving seat 13 formed in block 9 may if desired be coated or treated to promote ease of relative movement. Alternatively, the materials of the parts which move relative to each other may be chosen to minimise the friction.

Advantages of arrangements in accordance with the invention over existing arrangements include the following:

The torque required on the tensioning screw to apply suspension preload is reduced.

The use of a removable structural part (the lever arm) provides more space for fitting the suspension elements, thus simplifying the assembly process.

Efficient vessel structural design is facilitated by the fact that suspension loads are distributed to the most suitable structural areas.

It will be appreciated that the adjuster means need not be a screw device and that other mechanical, electrical, hydraulic or pneumatic means may if desired be employed to move the lever arm member 1 relative to the support surface and thus achieve the tensioning of the suspension element 2.

It will be further appreciated that, if desired, the lever arm member 1 may be fitted with adjuster means at both locations 6 and 7 and that, in such circumstances, the adjuster means may be similar (e.g. both may be screw adjusters) or they may be different.

In applications such as superconducting magnet supports, a large number of substantially concentric vessels and shields are provided, as parts of a cryogenic vessel. Only a minimum spacing is provided between on vessel or shield and the next, in order to provide a minimum outer dimension. The tensioning arrangement of the present invention must be located between the walls of such vessels and shields, and so should be of low profile, yet be simple to adjust even when in position between the vessel and shield walls. The tensioning arrangement of the present invention may be low profile, and can be simply adjusted by a socket wrench or similar, in an axis which lies in the plane of the suspension member. Such an arrangement provides easy adjustment of the tensioning means when built into a cryogenic vessel while also being of low profile to fit within the minimum spacing provided.

The invention claimed is:

1. An arrangement of concentric vessels or shields, one suspended within another, comprising a tensioning arrangement located between walls of first and second vessel(s) and/or shield(s), said tensioning arrangement comprising an elongate suspension member attached to the first concentric vessel or shield under tension at a predetermined location relative to a support surface on the second concentric vessel or shield; the arrangement comprising a detachable lever arm member having a component adapted to engage with and retain said elongate suspension member remotely from said first vessel or shield, wherein said lever arm member is formed with first and second bearing means adapted to bear respectively against first and second spaced-apart regions of said support surface and wherein at least said first bearing means incorporates an adjuster means permitting the said lever arm member to be moved relative to said first region of said support surface, thereby to permit adjustment of tension in said elongate suspension member.

2. The arrangement according to claim 1, wherein the elongate suspension member is substantially planar, and the adjuster means is adjustable by rotation about an axis which lies in the plane of the suspension member.

3. An arrangement according to claim 1, configured to give the adjuster means a mechanical advantage, relative to the suspension member.

4. An arrangement according to claim 1, wherein the said adjuster means comprises a screw arranged such that an end contacts the respective region of said support surface, and said first bearing means includes a threaded through-hole, formed in said lever arm member, to accommodate said screw.

5. An arrangement according to claim 4, wherein the end of the screw is formed with a spherical surface and the said first region of the support surface is formed with a correspondingly shaped recess (13) to accommodate said spherical surface.

6. An arrangement according to claim 5, wherein at least one of the said spherical surface of said screw and the surface of said recess co-operative therewith is coated or otherwise treated with a material which facilitates relative motion between the screw and the said co-operative surface of said recess.

7. An arrangement according to claim 5, wherein the said spherical surface of said screw and the surface of said recess co-operative therewith are made from materials selected to minimize friction between the screw and the recess.

8. An arrangement according to claim 1, wherein said second bearing means is formed with a suitably shaped contact surface which moves relative to said second region of the support surface when the first bearing means is adjusted.

9. An arrangement according to claim 8, wherein at least one of the said contact surface of said second bearing means and said second region of the support surface is coated or otherwise treated with a material which facilitates relative motion between them.

10. An arrangement according to claim 8, wherein the said contact surface of said second bearing means and said second region of the support surface are made from materials selected to minimize friction between them.

11. An arrangement according to claim 1, wherein the said elongate suspension member is substantially planar and loop-shaped; and the component of said lever arm member is adapted to engage with and retain said elongate suspension member comprises a boss member having a curved surface region over which said elongate suspension member is looped.

12. An arrangement according to claim 11, wherein said boss member is integrally formed with said lever arm member.

13. An arrangement according to claim 11, wherein said boss member is formed separately from said lever arm member and subsequently attached thereto.

14. A method for suspending one concentric vessel or shield within another, by tensioning an elongate, substantially planar, loop-shaped suspension member attached to a first of the vessel(s) and/or shield(s), comprising the steps of
- providing said elongate, substantially planar, loop-shaped suspension member between walls of the vessel(s) and/or shield(s),
- connecting the suspension member to a first of the vessel(s) and/or shield(s);
- providing a support surface having first and second spaced-apart regions on a second of the vessel(s) and/or shield(s); after the suspension member is connected, providing a detachable lever arm member having an engaging component adapted to engage with and support said elongate suspension member, wherein said lever arm member is formed with first and second bearing means adapted to bear on respective first and second spaced-apart regions of said support surface wherein at least said first bearing means incorporates an adjuster means permitting the said lever arm member to be moved relative to said first region of said support surface,
- then, looping the suspension member over the engaging component and adjusting tension in said suspension member by operation of said adjuster means.

* * * * *

UNITED STATES PATENT AND TRADEMARK OFFICE
CERTIFICATE OF CORRECTION

PATENT NO. : 7,665,313 B2 Page 1 of 1
APPLICATION NO. : 11/702506
DATED : February 23, 2010
INVENTOR(S) : Dixey et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 565 days.

Signed and Sealed this

Fourth Day of January, 2011

David J. Kappos
*Director of the United States Patent and Trademark Office*